United States Patent
Park

(12) 
(10) Patent No.: US 6,168,998 B1
(45) Date of Patent: *Jan. 2, 2001

(54) DUAL GATE MOSFET FABRICATION METHOD

(75) Inventor: Jeong-Soo Park, Choongcheongbuk-Do (KR)

(73) Assignee: LG Semicon Co., Ltd., Chungcheongbuk-Do (KR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/243,534

(22) Filed: Feb. 3, 1999

(30) Foreign Application Priority Data

Feb. 27, 1998 (KR) .................................. 98/6378

(51) Int. Cl.⁷ .................................. H01L 21/336
(52) U.S. Cl. .................. 438/283; 438/223; 438/241; 438/279
(58) Field of Search ................... 438/201, 241, 438/258, 264, 263, 266, 275, 277, 279, 283, 431, 437, 588, 594, 981, 223, 224, 227, 228

(56) References Cited

U.S. PATENT DOCUMENTS

| | | | |
|---|---|---|---|
| 4,397,077 | * 8/1983 | Derbenwick et al. | 438/981 |
| 5,057,449 | 10/1991 | Lowrey et al. | 437/60 |
| 5,081,054 | * 1/1992 | Wu et al. | 438/264 |
| 5,254,489 | * 10/1993 | Nakata | 438/981 |
| 5,340,764 | * 8/1994 | Larsen et al. | 438/201 |
| 5,404,037 | * 4/1995 | Manley | 257/321 |
| 5,432,114 | 7/1995 | O | 437/60 |
| 5,434,098 | * 7/1995 | Chang | 438/981 |
| 5,498,559 | * 3/1996 | Chang | 438/258 |
| 5,587,332 | * 12/1996 | Chang et al. | 438/258 |
| 5,861,347 | * 1/1999 | Maiti et al. | 438/981 |
| 5,904,518 | * 5/1999 | Komori et al. | 438/201 |

* cited by examiner

*Primary Examiner*—Charles Bowers
*Assistant Examiner*—Jack Chen
(74) *Attorney, Agent, or Firm*—Morgan, Lewis & Bockius LLP

(57) ABSTRACT

A dual gate MOSFET fabrication method includes the steps of forming a first insulation layer on a semiconductor substrate, forming a first polysilicon layer on the first insulation layer, forming a first photoresist pattern on the first polysilicon layer, forming a first gate by sequentially etching the first polysilicon layer and the first insulation layer by using the first photoresist pattern as a mask, removing the first photoresist pattern, forming a second insulation layer on the semiconductor substrate and the first gate, forming a second polysilicon layer on the second insulation layer, forming a second photoresist pattern on the second polysilicon layer, and forming a second gate by etching the second polysilicon layer and the second insulation layer by using the second photoresist pattern as a mask.

10 Claims, 2 Drawing Sheets

DUAL GATE MOSFET FABRICATION METHOD

This application claims the benefit of Korean patent application No. 6378/1998, filed Feb. 27, 1998, which is hereby incorporated by reference.

BACKGROUND OF THE INVENTION

1. Field of the Invention

The present invention relates to a dual gate MOSFET (Metal Oxide Semiconductor Field Effect Transistor), and more particularly, to an improved fabrication method for the dual gate MOSFET.

2. Discussion of the Related Art

FIGS. 1A through 1D are schematic cross-sectional views sequentially illustrating a fabricating method for a dual gate MOSFET according to a conventional method.

Figure 1A:
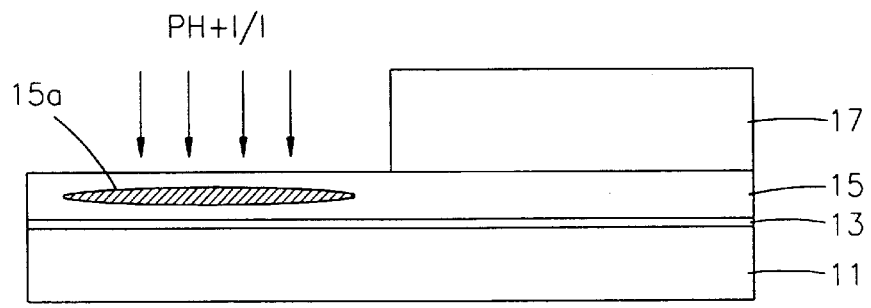

As shown in FIG. 1A, a gate oxide layer 13 is formed on a silicon substrate 11. An undoped polysilicon layer 15 is formed on the gate oxide layer 13.

A first photoresist pattern 17 is formed on the polysilicon layer 15. The first photoresist pattern 17 is formed by patterning a first photoresist layer, exposing a portion of the undoped polysilicon layer 15 that will become an n-type polysilicon layer.

Subsequently, group V ions, such as $P^+$ or $As^+$, are implanted into the exposed portion of the polysilicon layer 15 to form a doped polysilicon region 15a including n-type impurities.

Figure 1B:
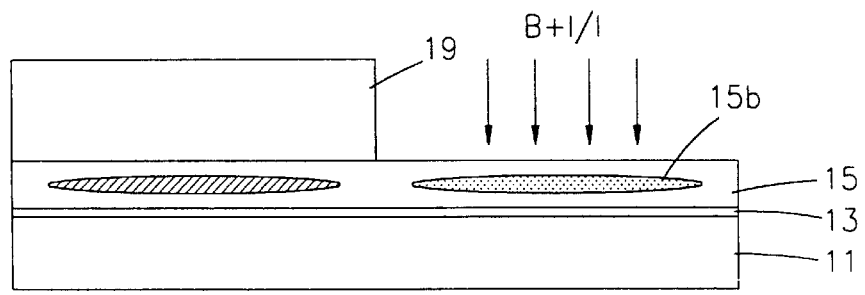

As shown in FIG. 1B, the first photoresist pattern 17 is removed, and a second photoresist pattern 19 is formed on the undoped polysilicon layer 15 having the doped polysilicon region 15a formed therein. The second photoresist pattern 19 is formed by patterning a second photoresist layer, exposing a portion of the undoped polysilicon layer 15 that will become a p-type polysilicon layer.

Then, group III ions, such as $B^+$ or $BF_2^+$, are implanted into the exposed portion of the polysilicon layer 15 to form a doped polysilicon region 15b.

Figure 1C:
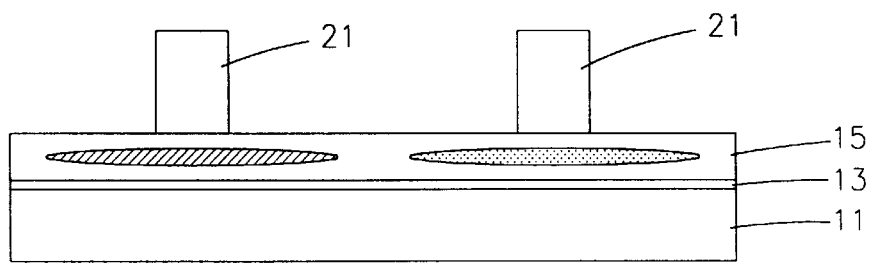

As shown in FIG. 1C, a pair of third photoresist patterns 21 are formed on the polysilicon layer 15. The third photoresist patterns 21 are formed by patterning a third photoresist layer to correspond to gates, which are to be formed subsequently.

Figure 1D:
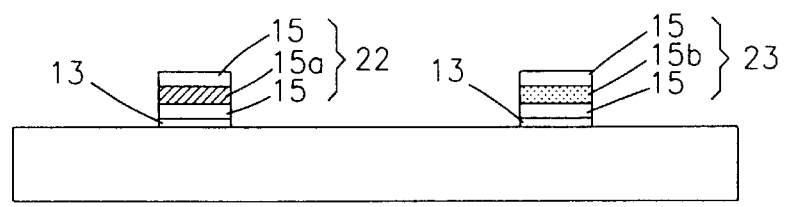

As illustrated in FIG. 1D, using the third photoresist patterns 21 as masks, the n-type and p-type ion-implanted polysilicon layer 15 and the gate oxide layer 13 are sequentially etched to form a first gate 22 and a second gate 23. Then, the third photoresist patterns 21 are removed. The first and second gates 22, 23 are therefore called dual gates.

However, according to the conventional dual gate fabrication method, the doped polysilicon regions 15a, 15b, which are doped differently from each other, are simultaneously etched using an identical etching technique to form the first and second gates 22, 23, whereby profiles of the first and second gates 22, 23 are disadvantageously different from each other.

Further, it has been difficult to dope ions into the gates 22, 23 when the gates 22, 23 need to be made thin.

SUMMARY OF THE INVENTION

Accordingly, the present invention is directed a to dual gate MOSFET fabrication method that substantially obviates one or more of the problems due to limitations and disadvantages of the related art.

An object of the present invention is to provide a dual gate MOSFET fabricating method which forms a pair of dual gates with identical profiles during a fabrication process, and overcoming difficulties in ion-implanting by considering respective thicknesses of the gates.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In one aspect of the present invention there is provided a dual gate MOSFET fabrication method including the steps of forming a first insulation layer on a semiconductor substrate, forming a first polysilicon layer on the first insulation layer, forming a first photoresist pattern on the first polysilicon layer, forming a first gate by sequentially etching the first polysilicon layer and the first insulation layer by using the first photoresist pattern as a mask, removing the first photoresist pattern, forming a second insulation layer on the semiconductor substrate and the first gate, forming a second polysilicon layer on the second insulation layer, forming a second photoresist pattern on the second polysilicon layer, and forming a second gate by etching the second polysilicon layer and the second insulation layer by using the second photoresist pattern as a mask.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1A through 1D are cross-sectional views sequentially illustrating the fabrication of a dual gate MOSFET according to a conventional method; and FIGS. 2A through 2E are cross-sectional views sequentially illustrating a dual gate MOSFET fabricating method according to the present invention.

DETAILED DESCRIPTION OF THE PREFERRED EMBODIMENT

Reference will now be made in detail to a preferred embodiment of the present invention, an example of which is illustrated in the accompanying drawings.

FIGS. 2A through 2E are cross-sectional views sequentially illustrating a dual gate MOSFET fabricating method according to the present invention.

Figure 2A:
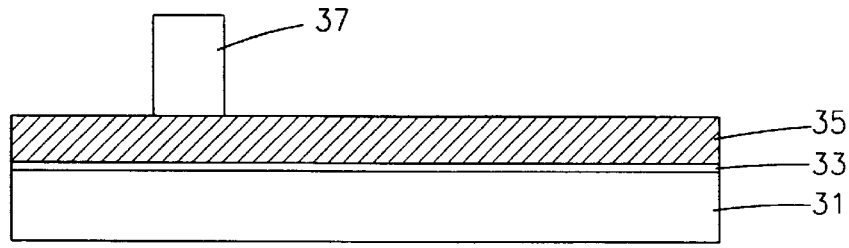

As shown in FIG. 2A, a first insulation layer 33 is formed on a silicon substrate 31, the first insulation layer 33 being formed of an oxide. A first polysilicon layer 35 is formed on the first insulation layer 33. The first polysilicon layer 35 is doped with $n^+$ (or $p^+$) ions. A first photoresist pattern 37 is formed on the first polysilicon layer 35 which corresponds to a first gate 39 that will be formed subsequently.

Figure 2B:

As shown in FIG. 2B, using the first photoresist pattern 37 as a mask, the first polysilicon layer 35 and the first insulation layer 33 are etched to form the first gate 39. Then, the first photoresist pattern 37 is removed.

Figure 2C:
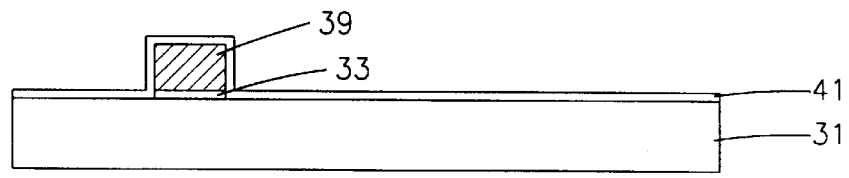

As shown in FIG. 2C, a second insulation layer 41, which is formed of an oxide, is deposited on the semiconductor substrate 31 and the first gate 39.

Figure 2D:
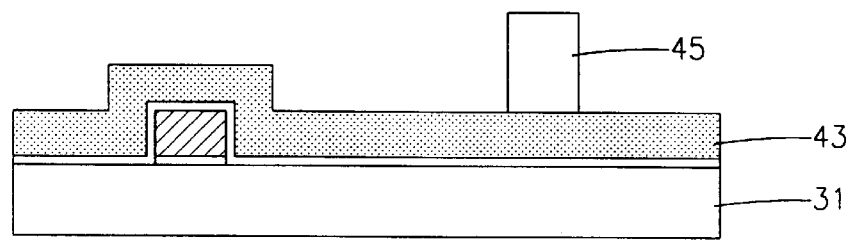

Referring to FIG. 2D, a second polysilicon layer 43 is formed on the insulation layer 41, wherein the second polysilicon layer 43 is doped with p$^+$ (or n$^+$)ions. A second photoresist pattern 45 is formed on the second polysilicon layer 43 to correspond to a second gate 47 that will be formed subsequently.

Figure 2E:
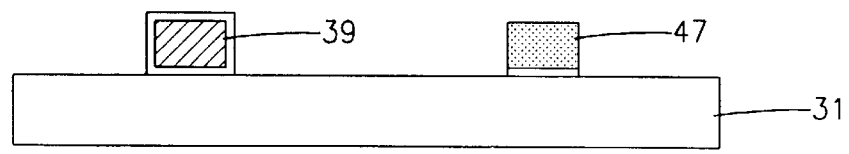

Finally, as shown in FIG. 2E, using the second photoresist pattern 45 as a mask, the second polysilicon layer 43 and the second insulation layer 41 are sequentially etched to form a second gate 47. Then, the second photoresist pattern 45 is removed.

As described above, the dual gate MOSFET fabrication method of the present invention does not require a separate ion-implantation process for forming a doped polysilicon layer in the gates. Instead, it simplifies the fabrication steps because the polysilicon layer is doped in situ. Also, the present invention overcomes the disadvantage of ion-implanting during fabrication of a thin gate.

Further, the pair of separate polysilicon layers, one doped with n-type impurities and the other doped with p-type impurities, are separately etched instead of being simultaneous etched, thereby easily obtaining desired profiles of the first and second gates 39 and 47.

Still further, according to the present invention, the thickness of the insulation layer is adjusted during formation of the second insulation layer, thereby forming different gate oxides for NMOS and PMOS transistors.

While the invention has been described in detail and with reference to specific embodiments thereof, it will be apparent to those skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A dual gate MOSFET fabrication method comprising the steps of:

forming a first insulation layer on a semiconductor substrate;

forming a first polysilicon layer on the first insulation layer;

forming a first photoresist pattern on the first polysilicon layer;

forming a first gate by sequentially etching the first polysilicon layer and the first insulation layer by using the first photoresist pattern as a mask;

removing the first photoresist pattern;

forming a second insulation layer on the semiconductor substrate and the first gate;

forming a second polysilicon layer on the second insulation layer;

forming a second photoresist pattern on the second polysilicon layer; and forming a second gate by etching the second polysilicon layer and the second insulation layer by using the second photoresist pattern as a mask, wherein a thickness of the first gate is the same as a thickness of the second gate, and wherein, after the second insulation layer is etched, it covers a top surface of the first gate and sides of the first gate.

2. The method of claim 1, wherein the step of forming a first insulation layer and the step of forming a second insulation layers includes forming oxide layers.

3. The method of claim 1, wherein further including the steps of:

doping the first polysilicon layer with ions of a first conductivity type; and doping the second polysilicon layer with ions of a second conductivity type.

4. The method of claim 3, wherein the step of doping the first polysilicon layer includes the step of doping the first polysilicon layer with n+ impurities, and wherein the step of doping the second polysilicon layer includes the step of doping the second polysilicon layer with p+ impurities.

5. The method of claim 3, wherein the step of doping the first polysilicon layer includes the step of doping the first polysilicon layer with p+ impurities, and wherein the step of doping the second polysilicon layer includes the step of doping the second polysilicon layer with n$^+$ impurities.

6. A dual gate MOSFET fabrication method comprising the steps of:

forming a first insulation layer on a semiconductor substrate;

forming a first semiconductor layer on the first insulation layer;

forming a first photoresist pattern on the first semiconductor layer;

forming a first gate on the first insulating layer by sequentially etching the first semiconductor layer and the first insulation layer by using the first photoresist pattern as a mask;

removing the first photoresist pattern;

forming a second insulation layer on the semiconductor substrate and the first gate;

forming a second semiconductor layer on the second insulation layer;

forming a second photoresist pattern on the second semiconductor layer; and forming a second gate by etching the second semiconductor layer and the second insulation layer by using the second photoresist pattern as a mask, wherein a thickness of the first gate is the same as a thickness of the second gate, and wherein, after the second insulation layer is etched, it covers a top surface of the first gate and sides of the first gate.

7. The method of claim 6, wherein the step of forming a first insulation layer and the step of forming a second insulation layers includes forming oxide layers.

8. The method of claim 6, further including the steps of:

doping the first semiconductor layer with ions of a first conductivity type; and doping the second semiconductor layer with ions of a second conductivity type.

9. The method of claim 8, wherein the step of doping the first semiconductor layer includes the step of doping the first semiconductor layer with n+ impurities, and wherein the step of doping the second semiconductor layer includes the step of doping the second semiconductor layer with p+ impurities.

10. The method of claim 8, wherein the step of doping the first semiconductor layer includes the step of doping the first semiconductor layer with p+ impurities, and wherein the step of doping the second semiconductor layer includes the step of doping the second semiconductor layer with n$^+$ impurities.

* * * * *